(12) United States Patent
Kang

(10) Patent No.: US 7,079,411 B2
(45) Date of Patent: Jul. 18, 2006

(54) FERROELECTRIC NONVOLATILE CODE DATA OUTPUT DEVICE

(75) Inventor: Hee Bok Kang, Daejeongwangyeok-si (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 11/057,181

(22) Filed: Feb. 15, 2005

(65) Prior Publication Data

US 2005/0231994 A1     Oct. 20, 2005

(30) Foreign Application Priority Data

Apr. 20, 2004    (KR)   .................. 10-2004-0027069

(51) Int. Cl.
     *G11C 11/00*      (2006.01)

(52) U.S. Cl. ....................................... 365/145; 265/200

(58) Field of Classification Search ................ 365/145, 365/200, 189.05, 230.06
See application file for complete search history.

(56) References Cited

U.S. PATENT DOCUMENTS

| 5,359,726 | A | * | 10/1994 | Thomas ......................... 703/24 |
| 5,969,981 | A | * | 10/1999 | Kono .......................... 365/145 |
| 6,272,594 | B1 | | 8/2001 | Gupta et al. |
| 6,363,439 | B1 | | 3/2002 | Battles et al. |
| 6,597,608 | B1 | * | 7/2003 | Kang et al. .................. 365/200 |
| 6,646,903 | B1 | * | 11/2003 | Chow .......................... 365/145 |

* cited by examiner

*Primary Examiner*—Anh Phung
(74) *Attorney, Agent, or Firm*—Heller Ehrman LLP (57) ABSTRACT

A ferroelectric nonvolatile code data output device comprises a code bus command processing unit, a code bus decoder unit, a function block unit, a code bus, a data buffer and a data selecting unit. The ferroelectric nonvolatile code data output device for outputting code data stored in a nonvolatile coding cell for the operation of a nonvolatile ferroelectric memory (hereinafter, referred to as "FeRAM") to outside of chip through an input/output port to easily check corresponding data values.

6 Claims, 8 Drawing Sheets

FERROELECTRIC NONVOLATILE CODE DATA OUTPUT DEVICE

BACKGROUND ART

1. Field of the Invention

The present invention generally relates to a data output device, and more specifically, to a ferroelectric nonvolatile code data output device for outputting code data stored in a nonvolatile coding cell for the operation of a nonvolatile ferroelectric memory (hereinafter, referred to as "FeRAM") to outside of chip through an input/output port to easily check corresponding data values.

2. Description of the Prior Art

Generally, a ferroelectric memory device comprises nonvolatile coding cells in a function block such as a reconfiguration block or a redundancy block for storing various code data required in the operation of a chip.

However, it is necessary to output code data stored in the nonvolatile coding cells to the outside of the chip and to check the code data. That is, it is necessary to ascertain which coding cell data are currently stored in the reconfiguration block, whether the stored coding cell data are accurate or when the corresponding coding cell data are updated.

In case of the redundancy block, it is necessary to output the coding cell data stored in the redundancy block to the outside of the chip in order to ascertain what fail address data used in each redundancy coding block are or whether there is a redundancy block that is not used. Meanwhile, the existing fail address code data should be obtained to repair fail bits additionally generated in a burn-in-test. That is, the application of distinction results obtained by distinguishing the existing fail addresses from those newly generated to the redundancy algorithm can improve the redundancy efficiency.

SUMMARY OF THE INVENTION

Accordingly, it is an object of the present invention to output code data stored in nonvolatile coding cells of each function block in a nonvolatile ferroelectric memory to the outside of a chip to check the code data.

In an embodiment, a ferroelectric nonvolatile code data output device comprises a code bus command processing unit, a code bus decoder unit, a function block unit, a code bus, a data buffer and a data selecting unit. The code bus command processing unit activates a decoder enable signal and a code selecting enable signal when a code data output command is applied. The code bus decoder unit selectively activates a selecting signal in response to a decoder input signal when the decoder enable signal is activated. The function block unit, which comprises a plurality of function blocks for storing nonvolatile code data required in an operation of a chip, outputs the code data in response to the selecting signal. The code bus, which is shared by the function blocks, transmits the code data applied by the function block unit. The data buffer temporarily stores data inputted and outputted through an input/output port. The data selecting unit selectively connects the data buffer to one of a data bus and the code bus which transmit data of a memory cell array in response to the code selecting enable signal.

BRIEF DESCRIPTION OF THE DRAWINGS

Other aspects and advantages of the present invention will become apparent upon reading the following detailed description and upon reference to the drawings in which.

DETAILED DESCRIPTION OF THE PREFERRED EMBODIMENTS

The present invention will be described in detail with reference to the accompanying drawings.

Figure 1:
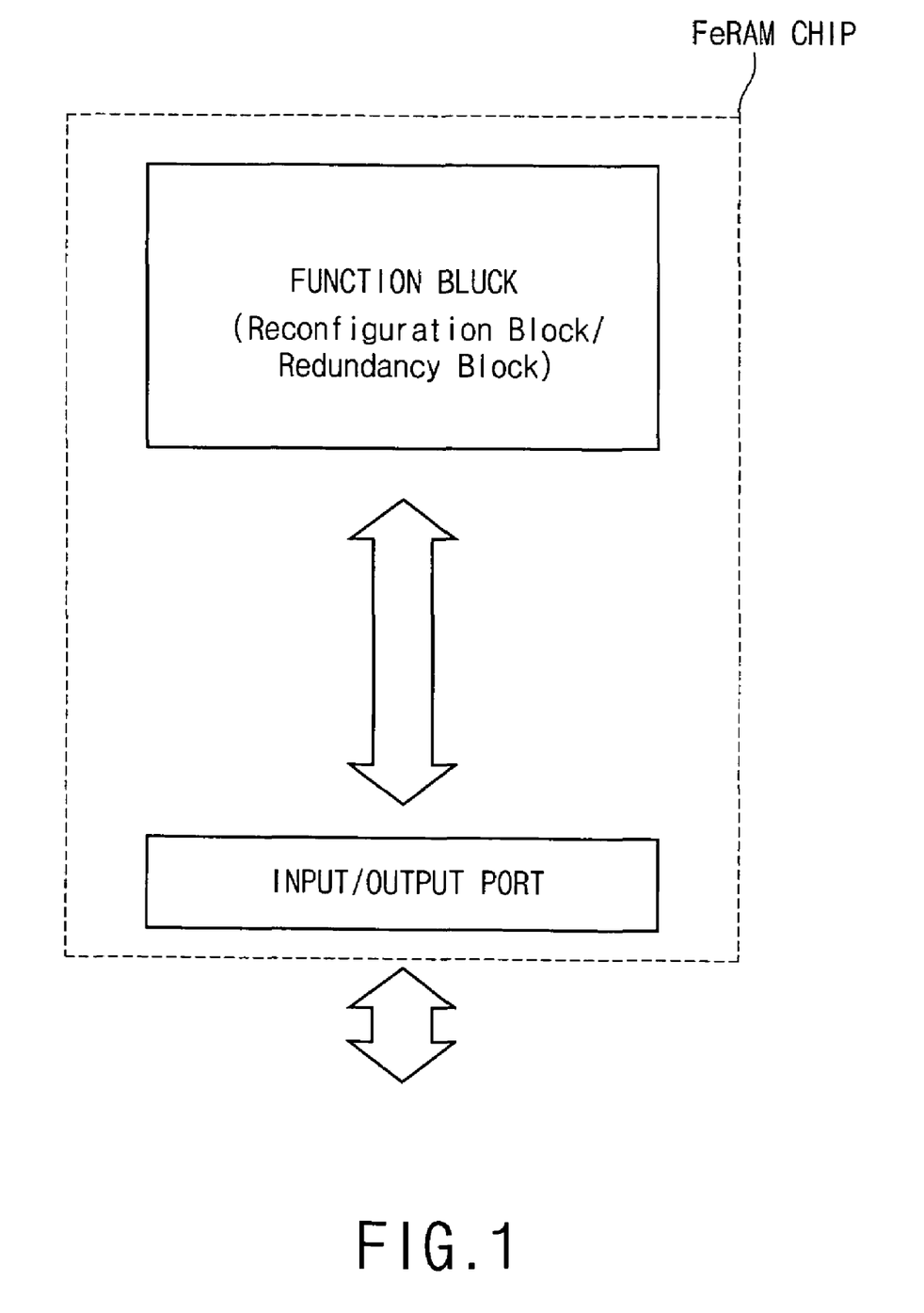
FIG. 1 is a diagram illustrating a FeRAM chip where code data stored in a function block are outputted through an input/output port according to an embodiment of the present invention.

FIG. 1 is a diagram illustrating a FeRAM chip where code data stored in a function block are outputted through an input/output port according to an embodiment of the present invention.

In an embodiment, a FeRAM chip includes various function blocks such as a reconfiguration block which frequently changes parameters. The corresponding parameters are outputted through an input/output (hereinafter, abbreviated as "I/O") port where cell data are inputted and outputted in order to easily check parameters stored in such function blocks.

When various burn-in-tests are performed, new fail addresses are additionally generated therefrom. In order to repair the fail addresses, the existing fail address code data stored in the redundancy block should be checked.

As a result, the corresponding code data are outputted through an I/O port in order to easily check the fail address code data currently stored in the redundancy block according to an embodiment of the present invention.

Figure 2:
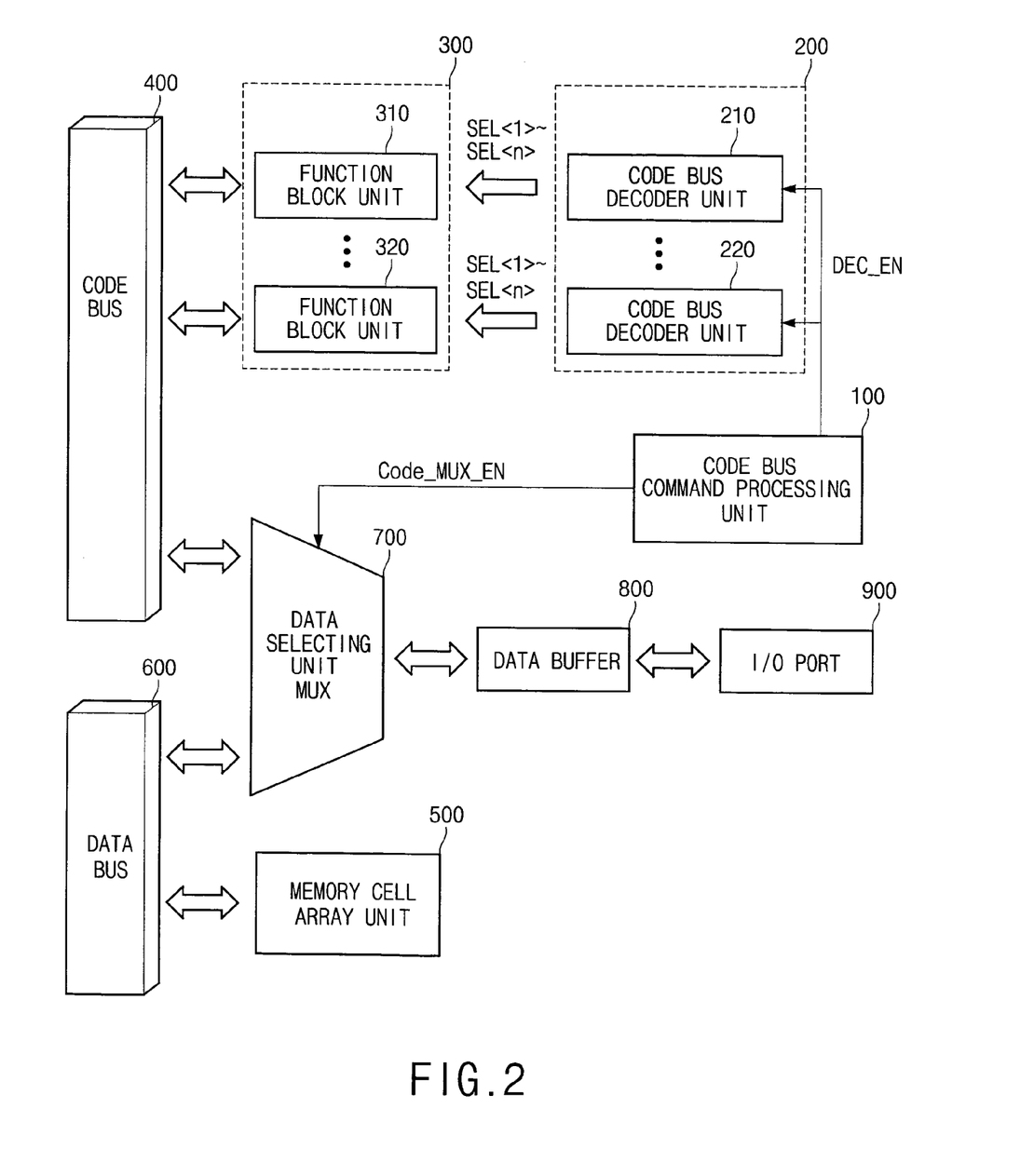
FIG. 2 is a diagram illustrating a code data input/output device according to an embodiment of the present invention.

FIG. 2 is a diagram illustrating a code data input/output device according to an embodiment of the present invention.

In an embodiment, a code data I/O device comprises a code bus command processing unit 100, a code bus decoder unit 200, a function block unit 300, a code bus 400, a memory cell array unit 500, a data bus 600, a data selecting unit 700, a data buffer 800 and an I/O port 900.

When the code data output command for outputting code data through the I/O port 900 is applied, the code bus command processing unit 100 activates a decoder enable signal DEC_EN and a code selecting enable signal Code_MUX_EN to output the signals to the code bus decoder unit 200 and the data selecting unit 700, respectively.

When a decoder enable signal DEC_EN is activated, the code bus decoder unit 200 selectively activates selecting signals SEL<1>~SEL<n> in response to a decoder input signal, and controls the output operation of the code data of the function block unit 300. When the decoder enable signal DEC_EN is activated, the code bus decoder unit 200 selectively activates one of the selecting signals SEL<1>~SEL<n> corresponding to specific function blocks 310 and 320 of the function block unit 300 in response to the decoder input signal and outputs the activated signal to the corresponding function block. The code bus decoder unit 200 comprises a plurality of code bus decoders 210 and 220 which correspond one by one to the functions blocks 310 and 320. The code bus decoders 210 and 220 selectively activates the selecting signals SEL<1>~SEL<n> to output the activated signals to the corresponding function blocks 310 and 320 in response to the decoder input signal.

The function block unit 300 stores nonvolatile code data required in the operation of the chip in nonvolatile coding cells, and applies the code data to the code bus 400 in response to the selecting signals SEL<1>~SEL<n>. The function block unit 300 comprises a plurality of the function blocks 310 and 320 which correspond one by one to a plurality of code bus decoders 210 and 220 and store different kinds of code data. Each of the function blocks 310 and 320 comprises a plurality of unit code bus driving units (n) for storing the code data and applying the code data to the code bus 400 in response to the selecting signals SEL<1>~SEL<n>.

The code bus 400 connects the block unit 300 and the data selecting unit 700 so that the code bus 400 is shared by the function blocks 310 and 320 in the chip, and transmits the applied code data to the data selecting unit 700 in response to the selecting signals SEL<1>~SEL<n>.

The memory cell array unit 500 stores write data applied externally through the I/O port 900, and senses and amplifies the stored data to output the data to the data bus 600.

The data bus 600 which connects the memory cell array unit 500 to the data selecting unit 700 transmits write data to the memory cell array unit 500 and data sensed in the memory cell array unit 500 to the data selecting unit 700.

The data selecting unit 700 selectively changes a data path in response to the code selecting enable signal Code_MUX_EN to connect the data buffer 800 to one of the code bus 400 and the data bus 600. That is, the data selecting unit 700 connects the code bus 400 to the data buffer 800 when the code selecting enable signal Code_MUX_EN is activated, and connects the data bus 600 to the data buffer 800 to exchange data when the code selecting enable signal Code_MUX_EN is inactivated.

The data buffer 800 temporarily stores data inputted and outputted through the I/O port 900.

Figure 3:
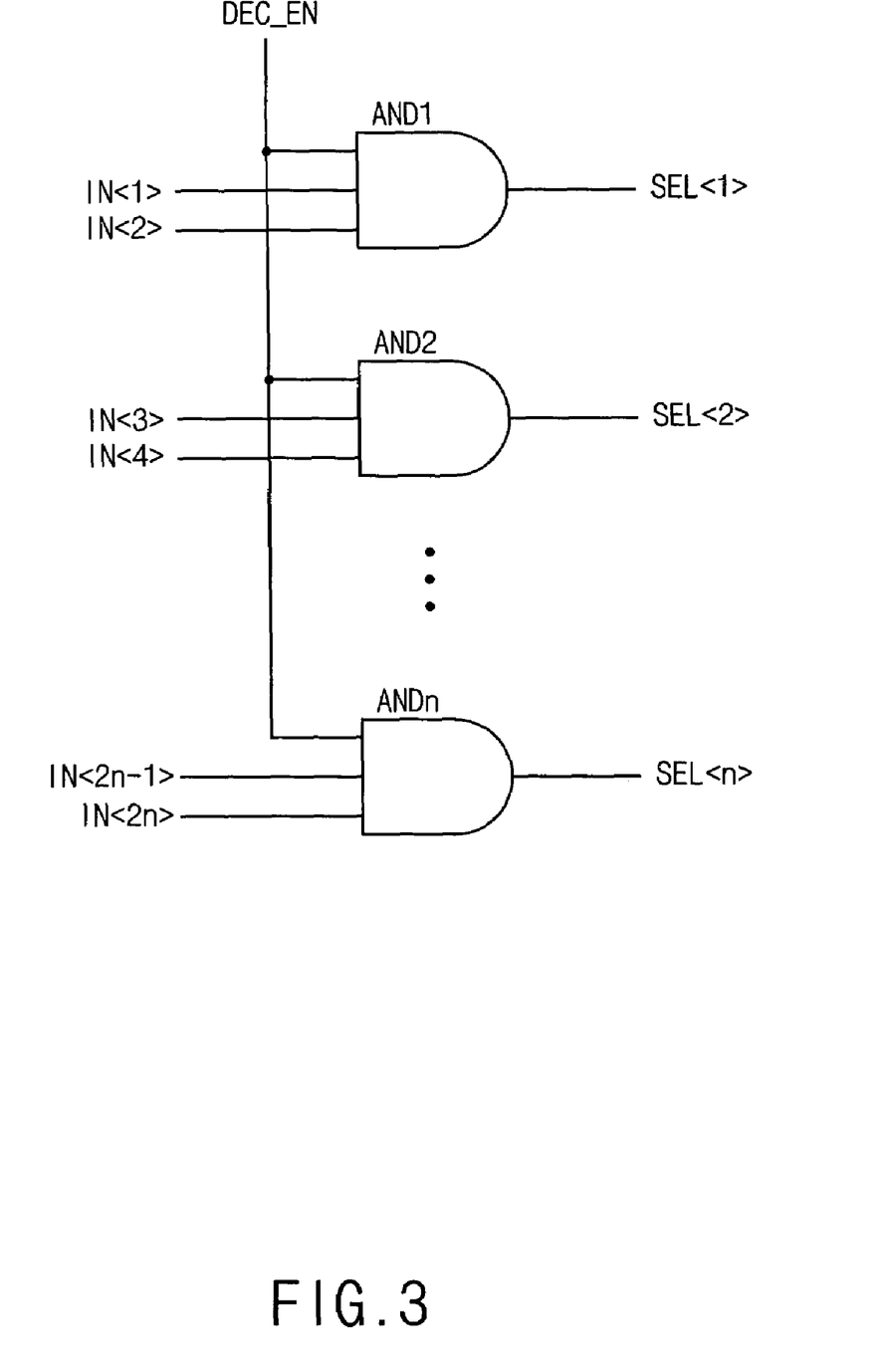
FIG. 3 is a circuit diagram illustrating a code bus decoder of FIG. 2.

FIG. 3 is a circuit diagram illustrating a code bus decoder of FIG. 2.

When the decoder enable signal DEC_EN is activated, the code bus decoders 210 and 220 selectively activate one of the selecting signals SEL<1>~SEL<n> in response to decoder input signals IN<1>~IN<2n> to output the activated signals to the corresponding function blocks 310 and 320. Each of the code bus decoders 210 and 220 comprises a plurality of AND gates AND1~ANDn each for performing an AND operation on the decoder enable signal DEC_EN and the decoder input signals IN<1>, IN<2>~IN<2n-1>, IN<2n> to selectively activate the selecting signals SEL<1>~SEL<n>.

Figure 4:
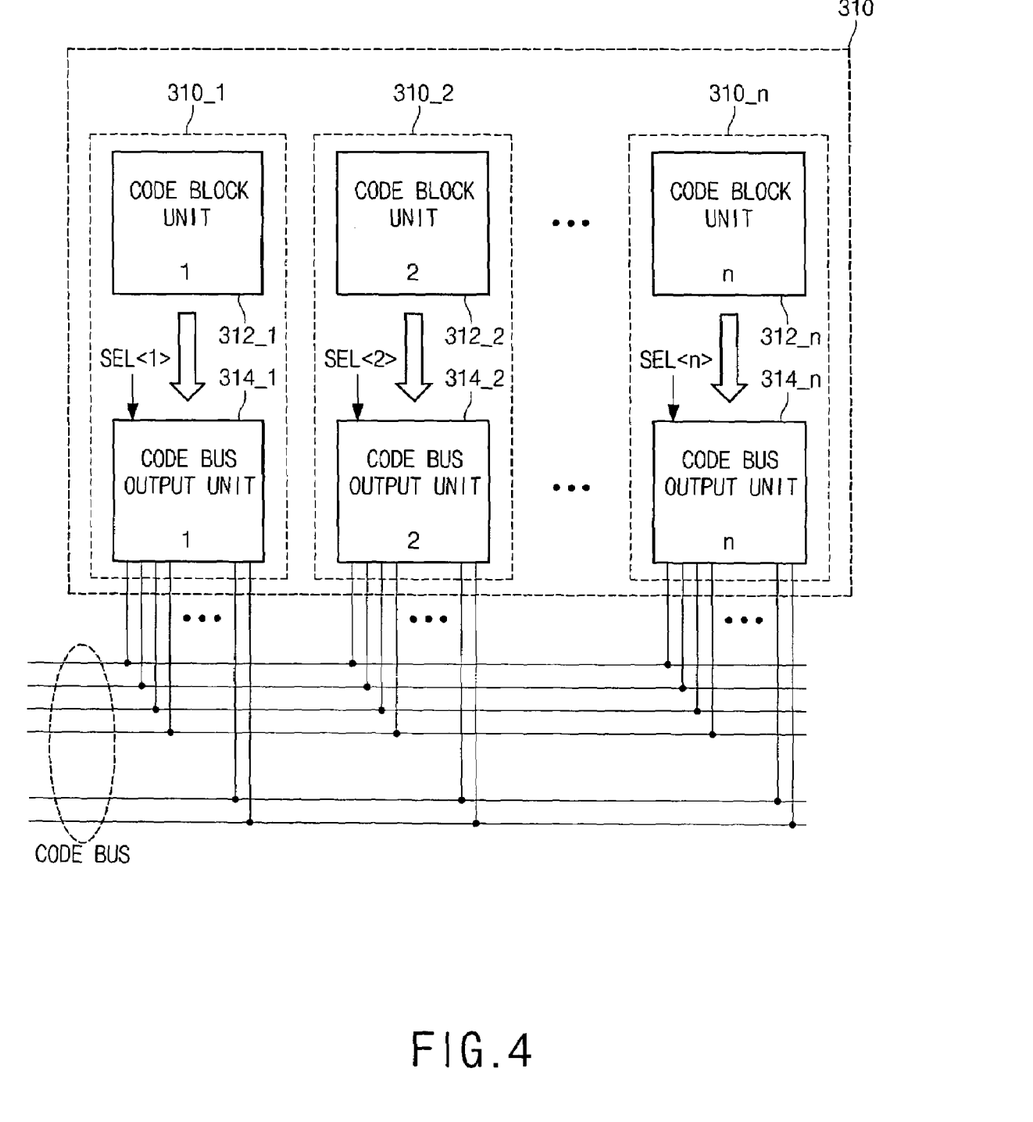
FIG. 4 is a diagram illustrating a function block of FIG. 2.

FIG. 4 is a diagram illustrating a function block of FIG. 2.

The function block 310 as a redundancy block for storing redundancy code data comprises a plurality of unit code bus driving units 310_1~310_n which share the code bus 400. Each of unit code bus driving units 310_1~310_n comprises a plurality (m) of nonvolatile coding cells for storing code data COD<1>~COD<m> each having m bits and for regulating a voltage level of the code bus 400 in response to the code data COD<1>~COD<m> stored when the selecting signals SEL<1>~SEL<n> are activated, thereby inducing code data to the code bus 400.

Each of the unit code bus driving units 310_1~310_n comprises m nonvolatile coding cells, which includes code block unit 312_1~312_n for storing code data of m bits and code bus output units 314_1~314_n that are connected to the code bus 400 to induce the code data COD<1>~COD<m> to code bus 400, respectively, in response to the selecting signals SEL<1>~SEL<n>.

Figure 5:
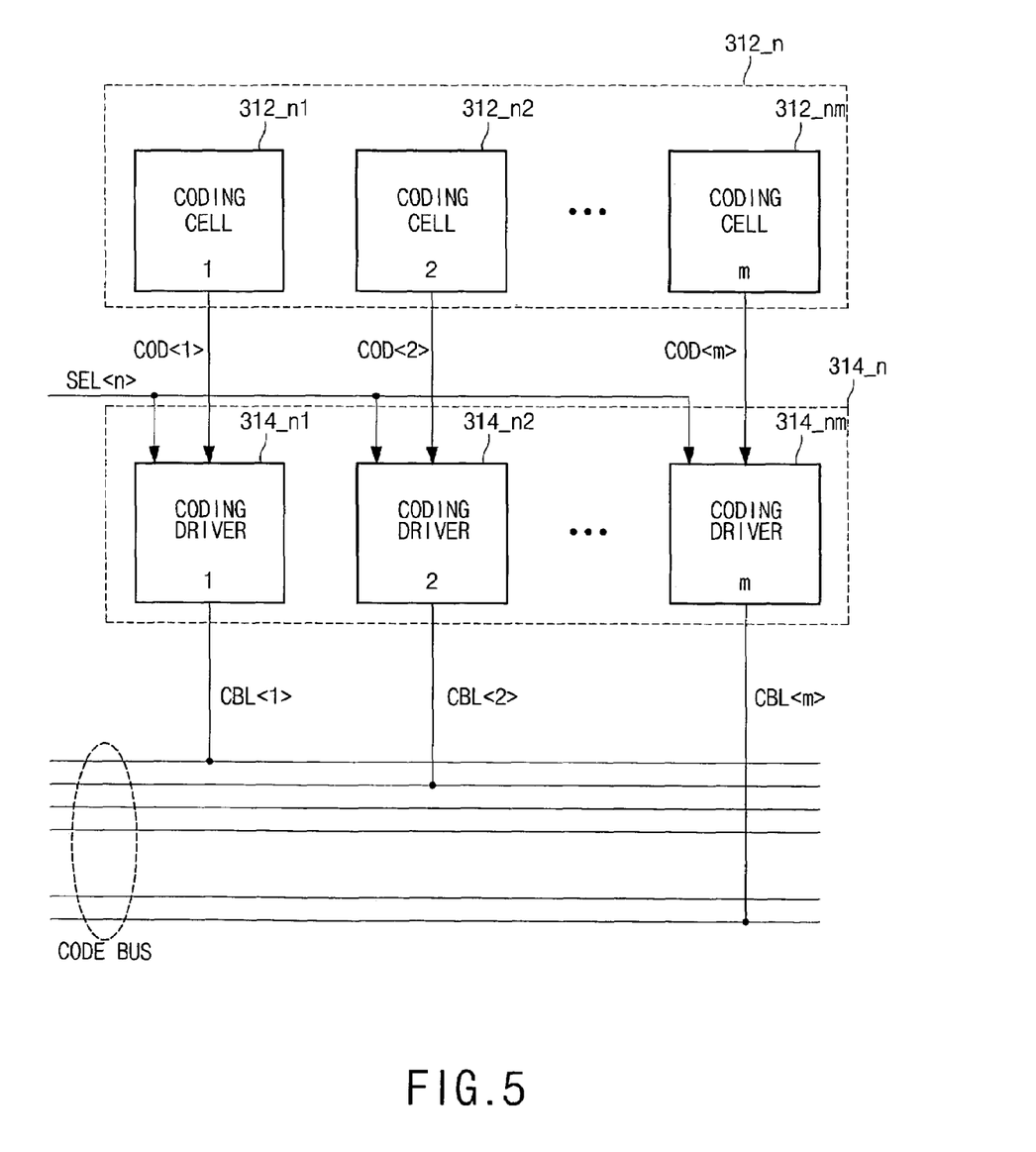
FIG. 5 is a diagram illustrating a unit code bus driving unit of FIG. 4.

FIG. 5 is a diagram illustrating a unit code bus driving unit of FIG. 4.

The code block unit 312_n comprises a plurality (m) of nonvolatile coding cells 312_n1~312_nm for storing the nonvolatile code data COD<1>~COD<m>.

The code bus output unit 314_n comprises a plurality of coding drivers 314_n1~314_nm which correspond one by one to the coding cells 312_n1~312_nm and code bus lines CBL<1>~CBL<m>. The plurality of coding drivers 314_n1~314_nm change voltage levels of the code bus lines CBL<1>~CBL<m> in response to the code data COD<1>~COD<m> of the coding cells 312_n1~312_nm when the corresponding selecting signal SEL<n> is activated.

Figure 6:
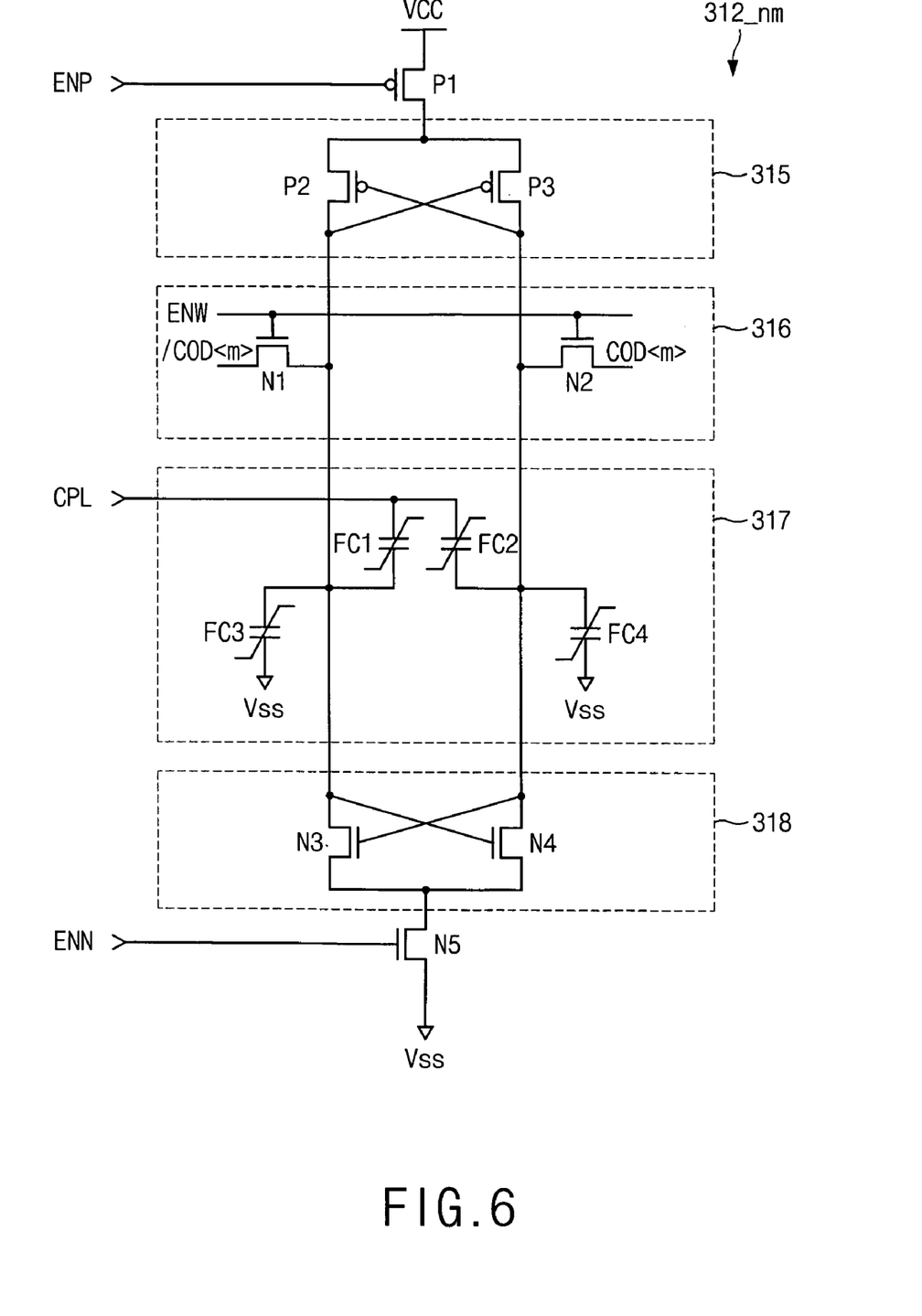
FIG. 6 is a circuit diagram illustrating a nonvolatile coding cell 312_nm of FIG. 5.

FIG. 6 is a circuit diagram illustrating a nonvolatile coding cell 312_nm of FIG. 5.

The nonvolatile coding cell 312_nm comprises a pull-up switch P1, a pull-up driving unit 315, a data I/O unit 316, a ferroelectric capacitor unit 317, a pull-down driving unit 318 and a pull-down switch N5.

The pull-up switch P1 is a PMOS transistor which is connected between a power voltage VCC terminal and the pull-up driving unit 315 and has a gate to receive a pull-up enable signal ENP. The pull-up switch P1 applies a power voltage VCC to the pull-up driving unit 315 when the pull-up enable signal ENP is activated.

The pull-up driving unit 315 drives the power voltage VCC applied from the pull-up switch P1. The pull-up driving unit 315 comprises PMOS transistors P2 and P3 which are connected with a latch type between the pull-up switch P1 and the data I/O unit 316.

The data I/O unit 316 inputs and outputs the code data COD<m> and /COD<m> in response to a write enable signal ENW. The data I/O unit 316 comprises NMOS transistors N1 and N2 which are connected between both data storage nodes of the coding cell 312_nm and both output terminals /COD<m> and COD<m>, respectively. A write enable signal ENW is applied to gates of the NMOS transistors N1 and N2.

The ferroelectric capacitor unit 317 generates a voltage difference in both data storage nodes in response to a cell plate signal CPL to store the code data COD<m> and/ COD<m> applied through the data I/O unit 316.

The pull-down driving unit 318 drives a ground voltage VSS applied from the pull-down switch N5. The pull-down driving unit 318 comprises NMOS transistors N3 and N4 which are connected with a latch type between the ferroelectric capacitor unit 317 and the pull-down switch N5.

The pull-down switch N5 is a NMOS transistor which is connected between the pull-down driving unit 318 and the ground voltage VSS terminal and has a gate to receive a pull-down enable signal ENN. When the pull-down enable signal ENN is activated, the pull-down switch N5 applies the ground voltage VSS to the pull-down driving unit 318.

The cell plate signal CPL is transited to 'high' by a power-up detection pulse generated when power reaches a stabilized level. Charges stored in ferroelectric capacitors FC1 and FC2 generate a voltage difference in both data storage nodes by capacitance load of the ferroelectric capacitors FC3 and FC4 when the cell plate signal CPL is applied as 'high'. When a sufficient voltage difference is generated in both storage nodes of the coding cell, the pull-up enable signal ENP and the pull-down enable signal ENN are activated to 'low' and 'high', respectively, to amplify data of both output terminals. When the amplification is completed, the cell plate signal CPL is transited to 'low', so that destroyed high data of the ferroelectric capacitor FC1 or FC2 is restored.

Figure 7:
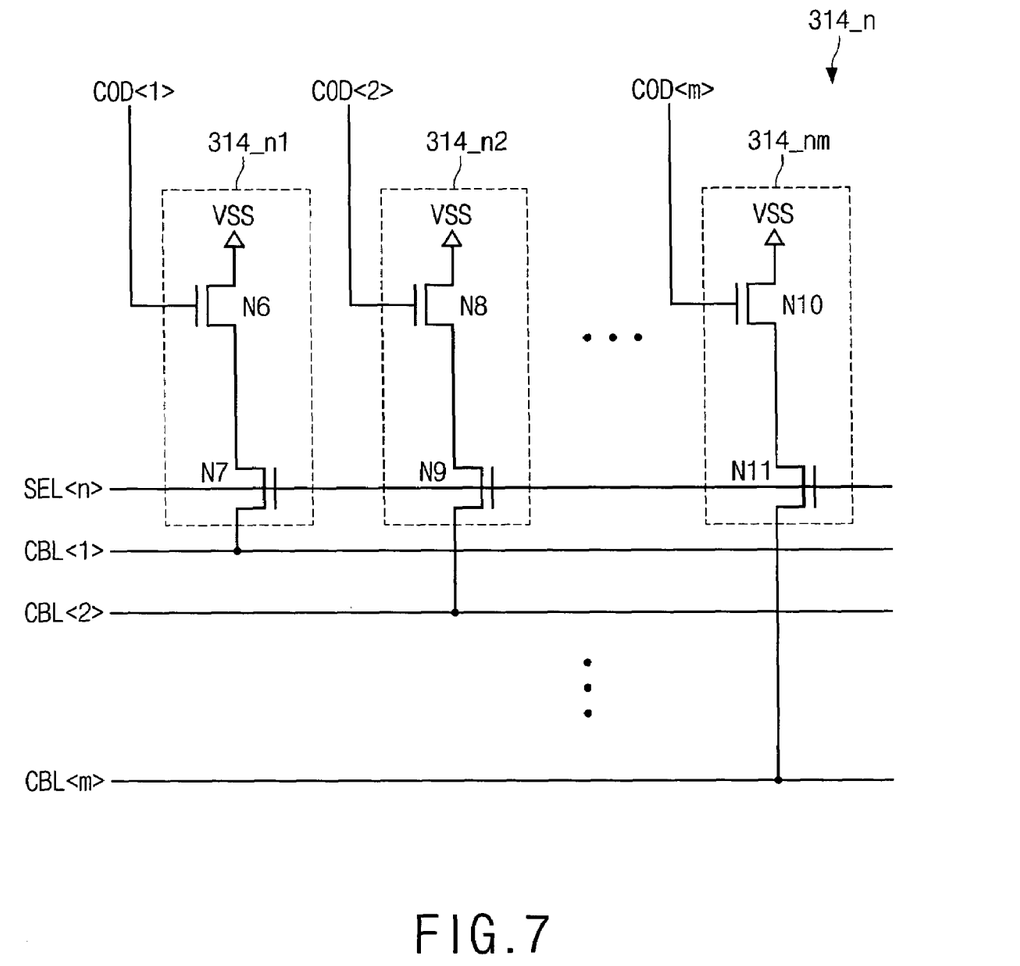
FIG. 7 is a diagram illustrating a code bus output unit of FIG. 5.

FIG. 7 is a diagram illustrating a code bus output unit 314_$n$ of FIG. 5.

The coding drivers 314_$n1$~314_$nm$ comprise NMOS transistors N6, N7~N10, N11 which are connected serially between the ground voltage VSS terminal and the code bus lines CBL<1>~CBL<m> and have gates to receive the corresponding code data COD<1>~COD<m> and the selecting signal SEL<n>. In other words, when the selecting signal SEL<n> is activated, the NMOS transistors N7, N9 and N11 are turned on, so that signal levels of the corresponding code bus lines CBL<1>~CBL<m> are determined in response to the code data COD<1>~COD<m>.

Figure 8:
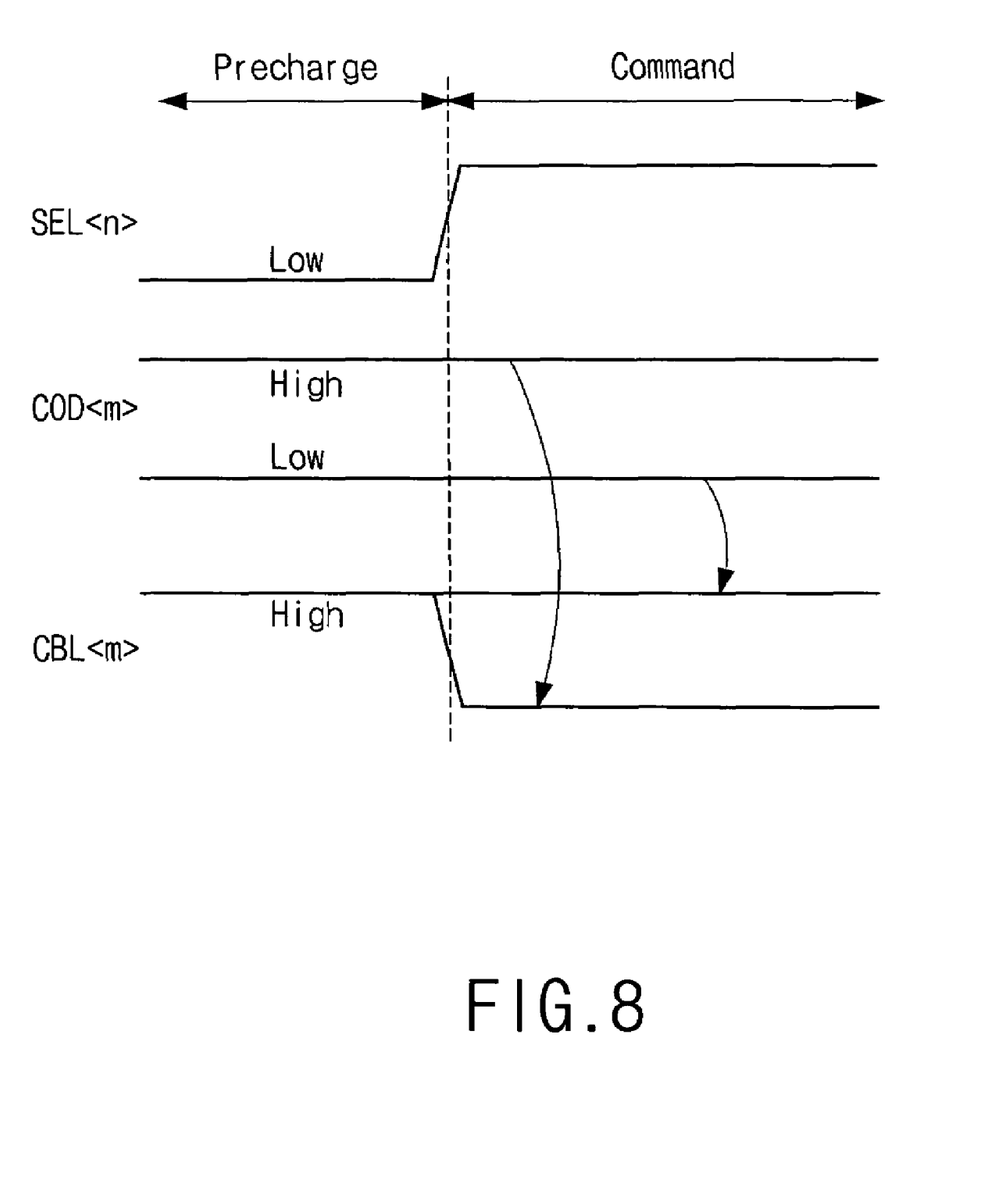
FIG. 8 is a timing diagram illustrating the operation of a code driver 314_nm of FIG. 7.

FIG. 8 is a timing diagram illustrating the operation of the code driver (314_$nm$) of FIG. 7.

At the initial stage of the operation, the code bus line CBL<m> is precharged to a high level. When the decoder enable signal DEC_EN is activated, the code bus decoder unit 200 activates the selecting signal SEL<n>. When the NMOS transistor N11 is turned on by activation of the selecting signal SEL<n>, a voltage level of the code bus line CBL<m> precharged to the high level is determined depending on that of the corresponding code data COD<m>. That is, when the code data COD<m> is 'high', the NMOS transistor N10 is turned on, so that the code bus line CBL<m> is pulled down to the ground voltage VSS. However, when the code data COD<m> is 'low', the NMOS transistor N10 is turned off, so that the code bus line CBL<m> is kept at the high level.

When the code bus command processing unit 100 is activated to check code data of the specific function block, the code bus command processing unit 100 activates the decoder enable signal DEC_EN and the code selecting enable signal Code_MUX_En to 'high'.

When the code selecting enable signal Code_MUX_EN is activated, the data selecting unit 700 changes the data path for connecting the data bus 600 to the data buffer 800 into one for connecting the code bus 400 to the data buffer 800.

When the decoder enable signal DEC_EN is activated, the code bus decoders 210 and 220 selectively activate one of the selecting signals SEL<1>~SEL<n> corresponding to the specific function blocks 310 and 320 in response to the decoder input signals IN<1>~IN<2$n$>. That is, the code bus decoder unit 200 controls the code data COD<1>~COD<m>stored in the different function blocks 210 and 220 so that they may not be simultaneously applied to the code bus 400.

When the selecting signals SEL<1>~SEL<n> are activated, the voltage level of the code bus 400 is changed by the code data COD<1>~COD<m> as shown in FIG. 8 to be applied to the code bus 400.

The code data COD<1>~COD<m> applied to the code bus 400 are outputted to the I/O port 900 through the data buffer 800 by the path change of the data selecting unit 700.

As described above, a ferroelectric nonvolatile code data output device according to an embodiment of the present invention outputs code data stored in nonvolatile coding cells of each function block to the outside of a chip through an I/O port for the operation of the chip, thereby improving the efficiency of the chip.

While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A ferroelectric nonvolatile code data output device, comprising:
    a code bus command processing unit for activating a decoder enable signal and a code selecting enable signal when a code data output command is applied;
    a code bus decoder unit for selectively activating a selecting signal in response to a decoder input signal when the decoder enable signal is activated;
    a function block unit, which comprises a plurality of function blocks for storing nonvolatile code data required in an operation of a chip, for outputting the code data in response to the selecting signal;
    a code bus, which is shared by the function blocks, for transmitting the code data applied by the function block unit;
    a data buffer for temporarily storing data inputted and outputted through an input/output port; and
    a data selecting unit for selectively connecting the data buffer to one of a data bus and the code bus which transmit data of a memory cell array in response to the code selecting enable signal.

2. The ferroelectric nonvolatile code data output device according to claim 1, wherein the function block comprises a plurality of unit code bus driving units which share the code bus and change a voltage level of the code bus in response to the code data to apply the code data to the code bus.

3. The ferroelectric nonvolatile code data output device according to claim 2, wherein the unit code bus driving unit comprises:
    a code block unit, which comprises a plurality of nonvolatile coding cells, for storing the code data; and
    a code bus output unit, which is driven when the selecting signal is activated, for regulating a voltage level of the code bus in response to the code data.

4. The ferroelectric nonvolatile code data output device according to claim 3, wherein the code bus output unit comprises a plurality of coding drivers which correspond one by one to the plurality of coding cells and to code bus lines of the code bus and are driven when the selecting signal for regulating a voltage level of the corresponding code bus line in response to the code data of the corresponding coding cell.

5. The ferroelectric nonvolatile code data output device according to claim 2, wherein the code bus decoder unit controls activation of the selecting signal so that only the code data of one of the unit code bus driving units in the function block unit is applied to the code bus in response to the decoder input signal.

6. The ferroelectric nonvolatile code data output device according to claim 5, wherein the code bus decoder unit comprises a plurality of code bus decoders which correspond one by one to the function blocks and selectively activate the selecting signal in response to the decoder input signal to selectively activate one of the unit code bus driving units in the corresponding function block.

* * * * *